United States Patent
Weiner et al.

(10) Patent No.: US 6,861,666 B1
(45) Date of Patent: Mar. 1, 2005

(54) APPARATUS AND METHODS FOR DETERMINING AND LOCALIZATION OF FAILURES IN TEST STRUCTURES USING VOLTAGE CONTRAST

(75) Inventors: Kurt H. Weiner, San Jose, CA (US); Gaurav Verma, Atherton, CA (US); Peter D. Nunan, Monte Sereno, CA (US); Indranil De, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 113 days.

(21) Appl. No.: 10/282,322

(22) Filed: Oct. 17, 2002

Related U.S. Application Data
(60) Provisional application No. 60/329,986, filed on Oct. 17, 2001.

(51) Int. Cl.[7] .............................................. H01L 23/58
(52) U.S. Cl. ........................................ 257/48; 257/775
(58) Field of Search ...................... 257/48, 775; 438/17

(56) References Cited

U.S. PATENT DOCUMENTS

| | | | |
|---|---|---|---|
| 3,961,190 A | 6/1976 | Lukianoff et al. | 250/310 |
| 4,644,172 A | 2/1987 | Sandland et al. | 250/548 |
| 4,900,695 A | 2/1990 | Takahashi et al. | 437/195 |
| 4,902,967 A | 2/1990 | Flesner | 324/158 R |
| 4,958,373 A | 9/1990 | Usami et al. | 382/8 |
| 5,430,305 A | 7/1995 | Cole, Jr. et al. | 250/559 |
| 5,489,852 A | 2/1996 | Gomez | 324/754 |
| 5,502,306 A | 3/1996 | Meisburger et al. | 250/310 |
| 5,537,669 A | 7/1996 | Evans et al. | 382/141 |
| 5,578,821 A | 11/1996 | Meisberger | 250/310 |
| 5,592,100 A | 1/1997 | Shida et al. | 324/751 |
| 5,665,968 A | 9/1997 | Meisburger et al. | 250/310 |

(List continued on next page.)

FOREIGN PATENT DOCUMENTS

| | | | |
|---|---|---|---|
| EP | 0 853 243 A2 | 7/1998 | G01R/31/307 |
| EP | 0 892 275 A2 | 1/1999 | G01R/31/305 |
| WO | WO 99/22310 | 5/1999 | G06F/17/00 |
| WO | WO 99/22311 | 5/1999 | G06F/17/00 |

OTHER PUBLICATIONS

Tugbawa, et al, "Pattern And Process Dependencies In Copper Damascene Chemical Mechanical Polishing Processes," Jun. 1998, VLSI Multilevel Interconnect conference (VMIC).

(List continued on next page.)

*Primary Examiner*—Jerome Jackson
(74) *Attorney, Agent, or Firm*—Beyer, Weaver & Thomas, LLP.

(57) ABSTRACT

Disclosed is test structure that can be fabricated with minimal photolithography masking steps and in which defects may be localized to specific layers. Mechanisms for fabricating such test structures are also provided. In one embodiment, a semiconductor test structure suitable for a voltage contrast inspection is provided. The test structure includes one or more test layers corresponding to one or more product layers selected from a plurality of product layers of an integrated circuit (IC) product structure. The number of the selected one or more test layers is less than a total number of the plurality of product layers of the product structure, and the test layers include at least a first portion that is designed to have a first potential during the voltage contrast inspection and a second portion that is designed to have a second potential during the voltage contrast inspection. The first potential differs from the second potential. The selected one or more test layers which correspond to product layers are selected from the plurality of product layers such that defects found in the test layers of the test structure during the voltage contrast inspection represent a prediction of defects in the corresponding product structure.

16 Claims, 3 Drawing Sheets

U.S. PATENT DOCUMENTS

| | | | | |
|---|---|---|---|---|
| 5,717,204 | A | | 2/1998 | Meisburger et al. ......... 250/310 |
| 5,736,863 | A | * | 4/1998 | Liu ............................. 324/765 |
| 5,804,459 | A | | 9/1998 | Bolam ......................... 438/12 |
| 5,959,459 | A | * | 9/1999 | Satya et al. ................. 324/751 |
| 5,976,898 | A | | 11/1999 | Marty et al. ................. 438/12 |
| 6,021,214 | A | | 2/2000 | Evans et al. ................ 382/141 |
| 6,061,814 | A | | 5/2000 | Sugasawara et al. ........ 714/724 |
| 6,091,249 | A | | 7/2000 | Talbot et al. ............... 324/751 |
| 6,210,983 | B1 | | 4/2001 | Atchison et al. .............. 438/14 |
| 6,232,787 | B1 | | 5/2001 | Lo et al. ...................... 324/751 |
| 6,252,412 | B1 | | 6/2001 | Talbot et al. ............... 324/750 |
| 6,265,232 | B1 | | 7/2001 | Simmons ..................... 438/14 |
| 6,268,717 | B1 | | 7/2001 | Jarvis et al. ................ 324/765 |
| 6,292,582 | B1 | | 9/2001 | Lin et al. .................... 382/149 |
| 6,324,298 | B1 | | 11/2001 | O'Dell et al. ................ 382/149 |
| 6,344,750 | B1 | | 2/2002 | Lo ............................... 324/751 |
| 6,426,516 | B1 | | 7/2002 | Sloman ....................... 257/48 |
| 6,448,098 | B1 | | 9/2002 | Milor ........................... 438/17 |
| 6,528,818 | B1 | | 3/2003 | Satya et al. ................... 247/48 |
| 6,642,726 | B2 | | 11/2003 | Weiner et al. .............. 324/751 |

OTHER PUBLICATIONS

Park et al, "Multi–Level Pattern Effects In Copper CMP," Oct 1999, CMP Symposium Electrochemical Society Meeting.

Weiner, et al. "Apparatus and Methods for Monitoring Self–Aligned Contact Arrays", U.S. Appl. No. 09/999,843, filed On Oct. 24, 2001.

* cited by examiner

APPARATUS AND METHODS FOR DETERMINING AND LOCALIZATION OF FAILURES IN TEST STRUCTURES USING VOLTAGE CONTRAST

CROSS REFERENCE TO RELATED APPLICATIONS

This application claims priority under U.S.C. 119(e) of U.S. Provisional Application, having an application No. 60/329,986, entitled APPARATUS AND METHODS FOR DETERMINATION AND LOCALIZATION OF FAILURES IN TEST STRUCTURES USING VOLTAGE CONTRAST, filed 17 Oct. 2001, by Kurt H. Weiner et al., which application is incorporated herein by reference in its entirety for all purposes.

BACKGROUND OF THE INVENTION

An SRAM cell array is a common test structure used in yield ramp. This is due to its ability to localize defects to within a given cell.

Unfortunately, the fabrication of the SRAM cell requires a large number of processing steps. For example, an isolation layer is formed, gates are patterned, junctions are patterned and formed, etc. Although most of the yield loss occurs as a result of the backend steps, the front-end steps must also be completed to make functioning SRAM blocks. Thus, all the backend processing, typically including three layers of metal and the passivation layer for the pads, must also be done before the devices can be tested electrically. Such extensive number of fabrication steps before yield loss may be determined is very time consuming.

An additional problem with the SRAM test structure is that even though the electrical defect is localized to a certain cell, it does not localize the failing layer. Failure analysis of the defective cell requires layer by layer deprocessing, which is also time consuming and expensive.

Accordingly, there is a need for improved test structures and methods for detecting defects. Additionally, there is a need for improved test structures that can be fabricated with a minimal photolithography masking steps or layers and in which defects can be localized to specific layers.

SUMMARY

Several embodiments of a test structure that can be fabricated with minimal photolithography masking steps and in which defects may be localized to specific layers are provided. Mechanisms for fabricating such test structures are also provided. In one embodiment, a semiconductor test structure suitable for a voltage contrast inspection is provided. The test structure includes one or more test layers corresponding to one or more product layers selected from a plurality of product layers of an integrated circuit (IC) product structure. The number of the selected one or more test layers is less than a total number of the plurality of product layers of the product structure, and the test layers include at least a first portion that is designed to have a first potential during the voltage contrast inspection and a second portion that is designed to have a second potential during the voltage contrast inspection. The first potential differs from the second potential. The selected one or more test layers which correspond to product layers are selected from the plurality of product layers such that defects found in the test layers of the test structure during the voltage contrast inspection represent a prediction of defects in the corresponding product structure.

In a specific implementation, the first portion and the second portion are arranged to allow detection of a defect's presence in either the first or second portion by inspecting only a sub-portion of either the first or second portion. In another aspect, the first portion is designed to charge significantly slower than the second portion during the voltage contrast inspection. In a further aspect, the test structure further includes a substrate, and the first portion is coupled to the substrate or a large conductive structure that is sized to allow the first portion to charge significantly slower than the second portion, the second portion being not coupled to the substrate or to the large conductive structure. The first and second portion can be arranged with respect to one another such that inspecting a sub-portion of the second portion allows detection of a short defect between the first portion and the second portion.

In a specific example, the product structure is an SRAM structure. In one embodiment, the one or more test layers include a single one of the conductive layers of the SRAM structure, and the other conductive layers of the SRAM structure are excluded from the semiconductor test structure. In another embodiment, the one or more test layers include a metal1 layer and a contact layer which is underneath the metal1 layer of the SRAM structure and exclude an isolation layer, a gate layer, an implant layer, and other metal layers besides metal1 layer. In a further aspect, the test structure includes a substrate. Te first portion has a plurality of first test stubs and a plurality of first test strips corresponding to a plurality of first stubs and a plurality of first strips of the SRAM structure, and each first test strip is coupled to a plurality of test stubs. The second portions include a plurality of second test stubs corresponding to a plurality of second stubs of the SRAM structure, and the second test stubs each are coupled to the substrate. In a further aspect, the first test stubs are each adjacent to a one of the first test stubs.

These and other features of the present invention will be presented in more detail in the following specification of the invention and the accompanying figures which illustrate by way of example the principles of the invention.

DETAILED DESCRIPTION OF SPECIFIC EMBODIMENTS

Figure 1:
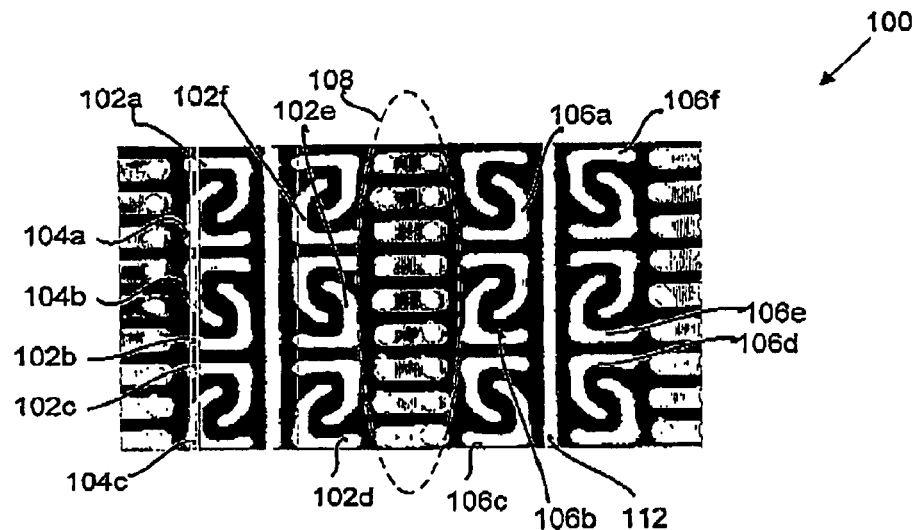
FIG. 1 shows the Metal-1 layer of an SRAM layout.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The SRAM test vehicle we describe here overcomes the limitations described above. Although the present invention is described in terms of an SRAM type test vehicle, of course, the techniques of the present invention may be applied to other types of patterns that require multiple processing steps, where defect detection is only relevant for a portion of the processing layers of such type of vehicle. Other suitable memory devices include, but are not limited to, DRAM, ROM, EPROM, EEPROM, and flash memory. Other suitable devices, besides memory, include, but are not limited to, a gate array, sea-of-gates, microprocessor, micro-controller, and micro-electromechanical device.

The present invention only utilizes the processing layers of a particular type of vehicle that are relevant for determining defect yield. For instance, only the backend layer or conductive layer under test and the contact layer underneath are fabricated for the test structure vehicle to test the backend conductive layer of a product device. In this example, the frontend metal, isolation, and implant layers are not fabricated for the test vehicle. Since several processing steps (e.g., for the front end) are not performed for the test vehicle, this allows for very quick turn around time for fabrication of the test vehicle.

Voltage contrast or electron beam inspection is then used for non-destructive testing of the test structure or vehicle. A voltage contrast inspection of a test structure is typically accomplished with a scanning electron microscope. The voltage contrast technique operates on the basis that potential differences in the various locations of a sample under examination cause differences in secondary electron emission intensities when the sample is the target of an electron beam. The potential state of the scanned area is acquired as a voltage contrast image such that a low potential portion of, for example, a wiring pattern might be displayed as bright (intensity of the secondary electron emission is high) and a high potential portion might be displayed as dark (lower intensity secondary electron emission). Alternatively, the system may be configured such that a low potential portion is displayed as dark and a high potential portion is displayed as bright.

A voltage contrast inspection is not only capable of localizing the defect, but is also capable of providing a high-resolution electron beam image of the defect. Localizing defects provides significant time and cost savings since failure analysis by layer deprocessing may be avoided. Detection of the defect with voltage contrast can also reap the benefits of "area-acceleration." Area acceleration allows a large test area to be monitored for electrical defects by performing electron inspection only over a relatively small area. Area acceleration can speed up the voltage contrast detection by orders of magnitude. Compared to the conventional full process flow testing methodology, the test vehicles of the present invention along with voltage contrast inspection is many times faster and less expensive.

Figure 2:
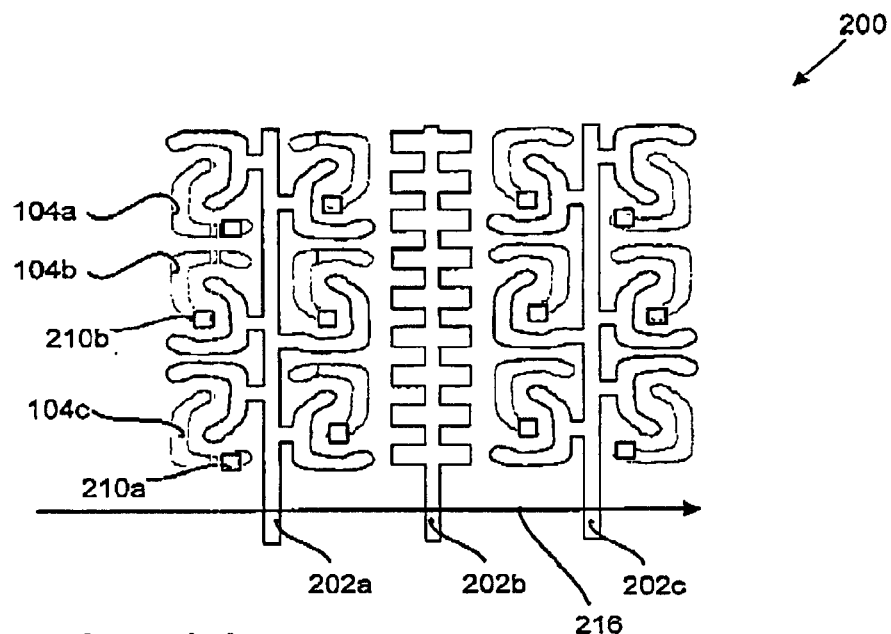
FIG. 2 shows an SRAM test vehicle that has been generated based on the SRAM Metal 1 pattern of FIG. 1 in accordance with one embodiment of the present invention.

The generation of an SRAM test vehicle is illustrated below with reference to FIGS. 1 and 2. FIG. 1 shows the Metal-1 layer 100 of an SRAM layout. Of course, the specific pattern of Metal 1 will vary from SRAM design to SRAM design. Additionally, the techniques of the present invention may be applied to other conductive layers of the SRAM pattern besides Metal 1. FIG. 2 shows an SRAM test vehicle 200 that has been generated based on the SRAM Metal 1 pattern 100 of FIG. 1 in accordance with one embodiment of the present invention.

In general terms, the rectangular array of the SRAM cell pattern 100 of FIG. 1 is retained in the test vehicle 200 of FIG. 2. If an electron beam moving across a portion of the test vehicle 200 would result in a particular potential pattern when there are no defects present within the test vehicle and a different potential pattern when there are defects present, then the test vehicle 200 may simply mimic the corresponding SRAM cell pattern. This may occur when the cell pattern 100 contains conductive areas that charge differently than other conductive areas during the electron beam scan.

For example, if the cell pattern contained one or more first conductive portions that was each coupled with a relatively large conductive structure or to the substrate and one or more floating conductive second portions that were not coupled with the large conductive structure or to the substrate, the first portions would charge more slowly than the second portions. Thus, the first portions would have a different potential than the second portions when there were no defects present during a voltage contrast inspection.

In contrast, a defect, such as a short or an open defect, may cause at least one of the first portions to have the same potential as one of the second portions, or visa versa. For example, an open defect in any first portion may cause part of the first portion to not be coupled with the large conductive structure and thereby have a same potential as the second portion that is not coupled with the relatively large conductive structure during a voltage contrast inspection. By way of another example, a short between a second portion and a first portion would result in the two shorted portions having a same potential and resulting intensity value during a voltage contrast inspection.

However, in the illustrated embodiment, the cell pattern portions would have the same potential during an electron beam scan whether or not there is a defect present within the pattern portions. Thus, the cell pattern 100 of FIG. 1 is modified to produce different potentials within the test vehicle 200 when there is a defect, as compared to when there is not a defect. Preferably, portions of the pattern that tend to short together are modified so that such a short is detectable during the voltage contrast inspection. That is, a short between two portions of the pattern will cause one of the portions to have a different potential than if the same portion was not shorted. Additionally, portions of the pattern that can have an open defect may also be modified so that an open defect is detectable during voltage contrast inspection. In other words, the open defect in a particular portion of the pattern results in a different potential than if such portion did not contain an open.

In the illustrated embodiment, the SRAM pattern 100 is modified so that shorts between particular conductive stubs of the pattern are detectable. In general, a first set of conductive stubs in the pattern are coupled to the substrate using contacts, while a second set of conductive stubs which are each adjacent to a one of the first stubs are not coupled to the substrate. The first set of stubs which are coupled to the substrate appear dark and the second set of stubs appear bright under electron beam inspection. As shown in FIG. 2, stubs 104a, 104b, and 104c of the SRAM cell pattern 100 of FIG. 1 are coupled with the substrate via contacts (e.g., contacts 210a and 210b). The second set of conductive stubs of the pattern may be connected to a conductive railing of the pattern and left floating. As shown, stubs 102a through 102f of FIG. 1 are coupled to railing 110 to thereby form floating structure 202a of FIG. 2, which is not coupled to the substrate. The floating structure 202c of FIG. 2 is similarly produced by coupling stubs 106a through 106f with railing 112 of FIG. 1. Stubs 108 of FIG. 1 are also coupled together to form floating structure 202b of FIG. 2 so that the test structure 200 may be scanned in a single direction (e.g., 216) to detect defects in the entire structure. Although floating structures are described as appearing bright and grounded structures which are coupled to the substrate as appearing dark during a voltage contrast inspection, of course, the voltage contrast inspection may be set up so that floating structures appear dark and grounded structures appear bright.

Shorts between any of the grounded conductive stubs (e.g., 104a through 104c) and the floating test structures (i.e., 202a through 202c) may be detected during a voltage contrast test. In this case, a shorted structure that was designed to be floating (202a through 202c) may no longer be floating, but grounded through the shorted stub. When a short has occurred, the shorted structure that was designed to be floating appears to have the same potential as the grounded stub to which it is shorted. For example, shorted structures appear dark since they are now coupled to ground. In contrast, if the floating structure are not shorted to a grounded stub, the floating structure appears bright. Thus, a short may be detected by scanning across any portion of a structure that is designed to be floating and determining whether such structures have a potential consistent with a floating structure (e.g., appears bright).

An inspection system may be set up to scan a charged particle beam, such as an electron beam, in a scanning electron microscope (SEM) or an e-beam review or inspection system, in direction 216, for example. That is, the electron beam is rastered across a swath as the test structure 200 as it moves in direction 216. After or during the electron beam scan, each scanned structure will have a specific potential that may be indicated as a particular brightness level within an image or an intensity level signal generated from charged particles, such as secondary or backscattered electrons, emitted from the scanned structure. These electrons are generated in response to the scanning electron beam.

The presence of a defect within a scanned structure may be determined by analyzing the resulting image or potential of the scanned structure. When a scanned structure appears bright, it is determined that there is no short defect within the scanned structure. When a scanned structure appears dark, it is determined that there is a short defect within the scanned structure. Of course, whether a defect results in a bright or dark image depends on how the inspection is set up. The location of the short defect may be determined by scanning perpendicular to the first scan direction 216 to find the location where the formerly floating structure is coupled with a grounded stub.

The test vehicle 200 of FIG. 2 is but one example of how the pattern 100 of FIG. 1 may be modified to detect defects. That is, the pattern 100 may be alternatively modified to test for open defects within railings 110 and 112. This may be accomplished by grounding each railing. Additionally, some of the conductive stubs may be coupled with the railing to form test structures (e.g., 202a and 202c), which are each grounded. When there is an open within a railing, the portion of the railing that is no longer grounded will appear bright and the portion of the railing that remains grounded will appear dark. Preferably, the railing is grounded at the end that is opposite the end of the railing that is scanned with the electron beam. For example, the structures 202a through 202c may be scanned in direction 216 to detect an open defect in such structures. A bright structure indicates an open defect in such structure, while a dark structure indicates no defect. The location of the open defect may be determined by scanning perpendicular to the first scan direction 216 to find where the structure transitions from bright to dark. This transition indicates the open defect's location.

Any suitable defect location technique may be utilized. Also, area acceleration techniques may be utilized for determined the presence of a defect. Several defect location and area acceleration techniques are described in (1) U.S. patent application Ser. No. 09/648,380, entitled TEST STRUCTURES AND METHODS FOR INSPECTION OF SEMICONDUCTOR INTEGRATED CIRCUITS, filed 25 Aug. 2000, by Akella V. S. Satya et al., (2) U.S. patent application Ser. No. 09/999,843, entitled APPARATUS AND METHODS FOR MONITORING SELF-ALIGNED CONTACT ARRAYS, filed 24 Oct. 2001, by Kurt H. Weiner et al., (3) U.S. patent application Ser. No. 10/000,114, entitled APPARATUS AND METHODS FOR RELIABLE AND EFFICIENT DETECTION OF VOLTAGE CONTRAST DEFECTS, filed 29 Jun. 2001, by Kurt H. Weiner et al., and (4) U.S. patent application Ser. No. 09/991,188, entitled APPARATUS AND METHODS FOR PREDICTING MULTIPLE PRODUCT CHIP YIELDS THROUGH CRITICAL AREA MATCHING, filed 14 Nov. 2001, by Kurt H. Weiner et al., which applications are incorporated herein by reference in their entirety.

Additionally, other types of test structures may be easily modified to implement the present invention. That is, any suitable voltage contrast type test structure may be modified so that only the relevant layer(s) are fabricated and tested and such layer(s) are modified to produce different voltage contrast results when a defect is present, as compared to when a defect is not present. Several suitable test structures are also described in detail in the above referenced patent applications.

Figure 3:
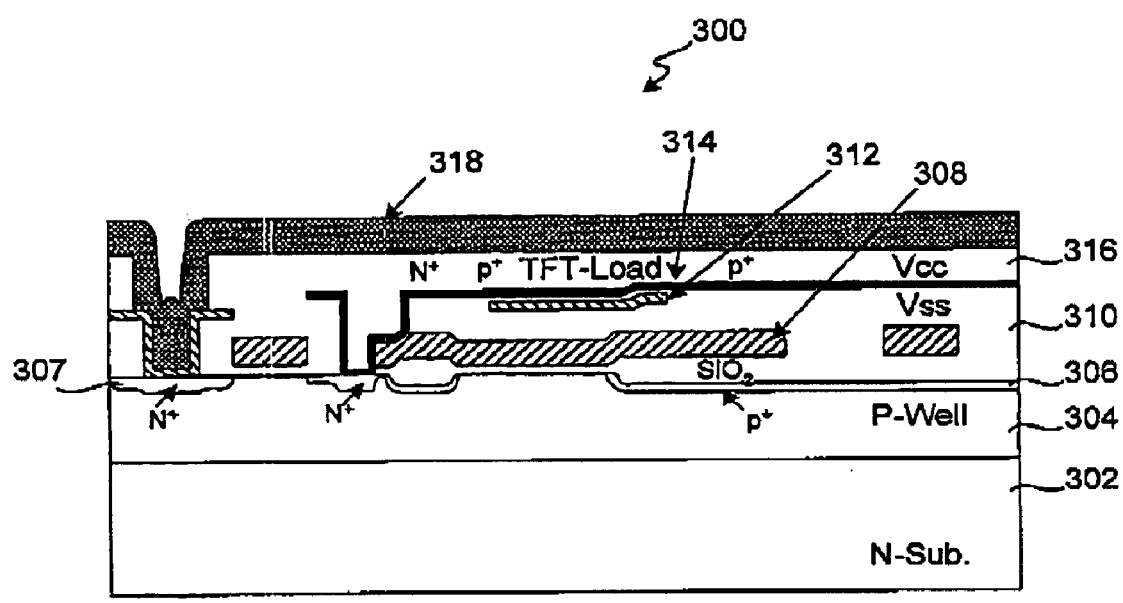
FIG. 3 is a diagrammatic cross-sectional view of an SRAM.

FIG. 3 is a diagrammatic cross-sectional view of a typical product SRAM cell 300. As shown, the SRAM cell 300 is formed from a significant number of complex layers. The test structure of the present invention is constructed from a subset of such layers. By way of example, the illustrated product SRAM cell of FIG. 3 includes a P-well layer 304 implanted within an N substrate 302. Additionally, a p+ layer 306 and n+ layer 307 are formed within P-well layer 304. The remaining upper layers of the SRAM cell are then formed from alternating layers of $SiO_2$ (e.g., 310 and 316) and metal or conductive layers (e.g., 308, 312, 314, and 318). In contrast to the product SRAM, the test structure SRAM may only include a single metal layer, such as (lie first metal layer 308, so as to test the integrity of such single metal layer. That is, the test structure excludes the other product layers, such as the isolation, gate, implant, and other metallization layers (e.g., 304, 306, 307, 310, 312, 314, 316, and 318). In an alternative embodiment, the test structure may be formed from any one of the other metal layers, such as 312, 314, or 318. Of course, any other suitable layer type (e.g., a polysilicon layer) may be tested and thereby included within the test structure.

Figure 4:
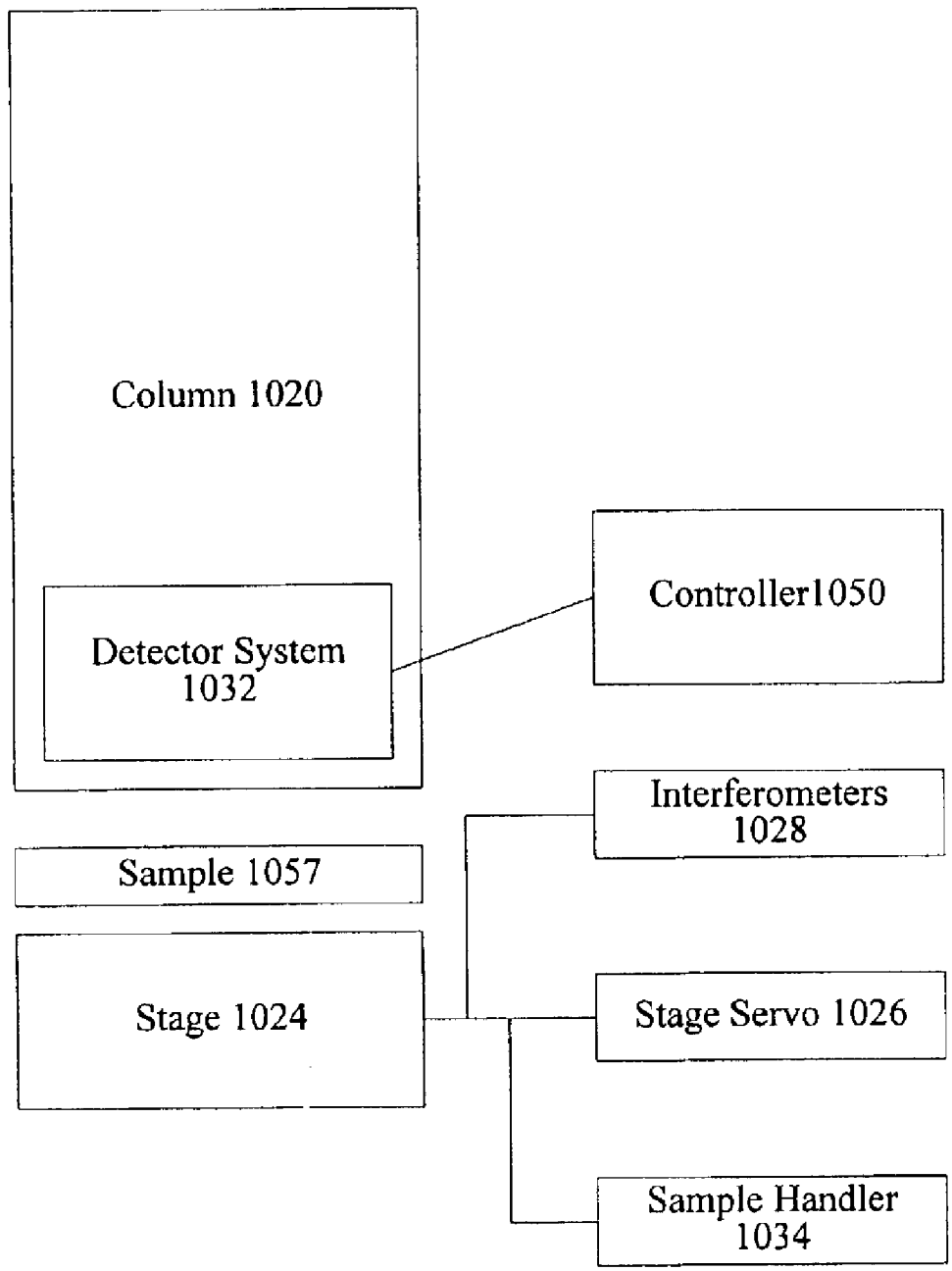
FIG. 4 is a diagrammatic representation of a system in which the techniques of the present invention may be implemented.

FIG. 4 is a diagrammatic representation of a scanning electron microscope (SEM) or an e-beam review or inspection system in which the techniques of the present invention may be implemented. The detail in FIG. 4 is provided for illustrative purposes. One skilled in the art would understand that variations to the system shown in FIG. 4 fall within the scope of the present invention. For example, FIG. 4 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The stage 1024 may be grounded to thereby ground the substrate of the sample 1057. The stage 1024 can be configured to have six degrees of freedom including movement and rotation along the x-axis, y-axis, and z-axis. In a preferred embodiment, the stage 1024 is aligned relative to be particle beam 1020 so that the x-directional motion of the stage is corresponds to the axis determined by the length of a via. For example, the sample 1057 can be aligned so that the x-directional movement of the stage corresponds to the length of a via as viewed from the top of the sample. Similarly, the sample 1057 can be aligned so that the x-directional movement of stage corresponds to the width of a via. Fine alignment of the sample can be achieved automatically or with the assistance of a system operator. The position and movement of stage 1024 during the analysis of sample 1057 can be controlled by stage servo 1026 and interferometers 1028.

While the stage 1024 is moving in the x-direction, the inducer 1020 can be repeatedly deflected back and forth in the y direction. According to various embodiments, the inducer 1020 is moving back and forth at approximately 100 kHz. According to a preferred embodiment, the stage 1024 is grounded to thereby ground the substrate and any structure tied to the substrate (e.g., source and drains) to allow voltage contrast between the floating and grounded structures as the result of the scan of the scan target.

A detector 1032 can also be aligned alongside the particle beam 1020 to allow further defect detection capabilities. The detector 1032 as well as other elements can be controlled using a controller 1050. Controller 1050 may include a variety of processors, storage elements, and input and output devices. The controller may be configured to implement the techniques of the present invention. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples and defect classification and position data.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A semiconductor test structure suitable for a voltage contrast inspection comprising:

one or more test layers corresponding to one or more product layers selected from a plurality of product layers of an integrated circuit (IC) product structure, wherein a number of the selected one or more test layers is less than a total number of the plurality of product layers of the product structure, wherein the test layers comprise a first portion that is designed to have a first potential during the voltage contrast inspection and a second portion that is designed to have a second potential during the voltage contrast inspection, the first potential differing from the second potential; and a substrate, wherein the second portion of the test layers comprises a plurality of second test stubs corresponding to a plurality of second stubs of the IC product structure, wherein the second stubs of the IC product structure are isolated from each other and the second test stubs are coupled together, and wherein the first portion of the test layers comprises a plurality of first test stubs corresponding to a plurality of first stubs of the IC product structure, the first test stubs each being coupled to the substrate or a large conductive structure that is sized to allow the first portion to charge significantly slower than the second portion during the voltage contrast inspection.

2. A semiconductor test structure as recited in claim 1, wherein the first portion and the second portion are arranged to allow detection of a defect's presence in either the first or second portion by inspecting only a sub-portion of either the first or second portion.

3. A semiconductor test structure as recited in claim 1, wherein the first and second portion are arranged with respect to one another such that inspecting a sub-portion of the second portion allows detection of a short defect between the first portion and the second portion.

4. A semiconductor test structure as recited in claim 1, wherein the IC product structure is an SRAM structure.

5. A semiconductor test structure as recited in claim 4, wherein the one or more test layers comprise a single one of the conductive layers of the SRAM structure, wherein the other conductive layers of the SRAM structure are excluded from the semiconductor test structure.

6. A semiconductor test structure as recited in claim 4, wherein the one or more test layers comprise a metal1 layer and a contact layer which is underneath the metal1 layer of the SRAM structure and exclude an isolation layer, a gate layer, an implant layer, and other metal layers besides metal1 layer.

7. A semiconductor test structure as recited in claim 6, wherein the first portion of the test layers comprises a plurality of first test stubs and a plurality of first test strips corresponding to a plurality of first stubs and a plurality of first strips of the SRAM structure, each first test strip being coupled to a plurality of test stubs, wherein the second portion of the test layers comprises plurality of second test stubs corresponding to a plurality of second stubs of the SRAM structure, the second test stubs each being coupled to the substrate.

8. A semiconductor test structure as recited in claim 7, wherein the first test stubs are each adjacent to a one of the first test stubs.

9. A method of fabricating a test structure comprising forming one or more test layers corresponding to one or more test layers corresponding to one or more product layers selected from a plurality of product layers of an integrated circuit (IC) product structure, wherein a number of the selected one or more test layers is less than a total number of the plurality of product layers of the product structure, wherein the test layers comprise a first portion that is designed to have a first potential during the voltage contrast inspection and a second portion that is designed to have a second potential during the voltage contrast inspection, the first potential differing from the second potential, and a substrates wherein the first portion comprises a plurality of second test stubs corresponding to a plurality of second stubs of the IC product structure, wherein the second stubs of the IC product structure are isolated from each other and the second test stubs are coupled together, and wherein the first portion comprises a plurality of first test stubs corresponding to a plurality of first stubs of the IC product structure, the first test stubs each being coupled to the substrate or a large conductive structure that is sized to allow the first portion to change significantly slower than the second portion during the voltage contrast inspection.

10. A method as recited in claim 9, wherein the first portion and the second portion are arranged to allow detection of a defect's presence in either the first or second portion by inspecting only a sub-portion of either the first or second portion.

11. A method as recited in claim 9, wherein the first and second portion are arranged with respect to one another such that inspecting a sub-portion of the second portion allows detection of a short defect between the first portion and the second portion.

12. A method as recited in claim 9, wherein the product structure is an SRAM structure.

13. A method as recited in claim 12, wherein the one or more test layers comprise a single one of the conductive layers of the SRAM structure, wherein the other conductive layers of the SRAM structure are excluded from the semiconductor test structure.

14. A method as recited in claim 12, wherein the one or more test layers comprise a metal1 layer and a contact layer which is underneath the metal1 layer of the SRAM structure and exclude an isolation layer, a gate layer, an implant layer, other metal layers besides metal1 layer.

15. A method as recited in claim 14, wherein the one or more test layers are formed over the substrate and wherein the first portion of the test layers comprises a plurality of first test stubs and a plurality of first test strips corresponding to a plurality of first stubs and a plurality of first strips of the SRAM structure, each first test strip being coupled to a plurality of test stubs, wherein the second portion of the test layers comprises plurality of second test stubs corresponding to a plurality of second stubs of the SRAM structure, the second test stubs each being coupled to the substrate.

16. A method as recited in claim 15, wherein the first test stubs are each adjacent to a one of the second test stubs.

* * * * *

UNITED STATES PATENT AND TRADEMARK OFFICE
CERTIFICATE OF CORRECTION

PATENT NO. : 6,861,666 B1  Page 1 of 1
DATED : March 1, 2005
INVENTOR(S) : Weiner et al.

It is certified that error appears in the above-identified patent and that said Letters Patent is hereby corrected as shown below:

<u>Column 6,</u>
Line 49, change "as (lie" to -- as the --.

<u>Column 9,</u>
Line 26, change "substrates wherein" to -- substrate, wherein --.
Line 35, change "to change" to -- to charge --.

Signed and Sealed this

Twenty-fourth Day of May, 2005

JON W. DUDAS
*Director of the United States Patent and Trademark Office*